United States Patent
Seol et al.

(10) Patent No.: US 12,421,623 B2
(45) Date of Patent: Sep. 23, 2025

(54) CYLINDRICAL SILICON INGOT MANUFACTURING METHOD

(71) Applicant: BCnC Co., Ltd., Icheon-si (KR)

(72) Inventors: Kwang Hee Seol, Icheon-si (KR); Seo Hwan Lee, Icheon-si (KR)

(73) Assignee: BCnC Co., Ltd., Icheon-si (KR)

( * ) Notice: Subject to any disclaimer, the term of this patent is extended or adjusted under 35 U.S.C. 154(b) by 86 days.

(21) Appl. No.: 18/369,372

(22) Filed: Sep. 18, 2023

(65) Prior Publication Data

US 2024/0102200 A1    Mar. 28, 2024

(30) Foreign Application Priority Data

Sep. 28, 2022 (KR) .................. 10-2022-0123325

(51) Int. Cl.
 *C30B 15/24* (2006.01)
 *C30B 15/36* (2006.01)
 *C30B 29/06* (2006.01)

(52) U.S. Cl.
 CPC .............. *C30B 29/06* (2013.01); *C30B 15/24* (2013.01); *C30B 15/36* (2013.01)

(58) Field of Classification Search
 CPC .......... C30B 29/06; C30B 15/36; C30B 15/24
 See application file for complete search history.

(56) References Cited

U.S. PATENT DOCUMENTS 3,025,146 A * 3/1962 Runyan ................. C30B 29/60
                                                                   117/936
2018/0282898 A1 * 10/2018 Hudelson ................ C30B 29/06

FOREIGN PATENT DOCUMENTS

| KR | 10-2003-0056731 A | 7/2003 |
|---|---|---|
| KR | 1020060073851 A | 6/2006 |
| KR | 10-1631368 B1 | 6/2016 |
| KR | 10-1714751 B1 | 3/2017 |
| RU | 2355831 C2 | 5/2009 |
| WO | WO-2021072239 A1 * | 4/2021 |

OTHER PUBLICATIONS

Korean Intellectual Property Office, "Request for the Submission of an Opinion" issued for Korean Application No. 10-2023-0003234 on Feb. 6, 2024.

* cited by examiner

*Primary Examiner* — Robert M Kunemund
(74) *Attorney, Agent, or Firm* — Bridgeway IP Law Group, PLLC; Hyun Woo Shin

(57) ABSTRACT

Provided is a cylindrical ingot manufacturing method including: an operation of supplying a silicon raw material to an inside of a crucible and heating the crucible to melt the silicon raw material; an operation of supplying a seed crystal having one end fastened to a seed shaft to the inside of the crucible; and an operation of moving the seed crystal from a lower portion of the crucible to an upper portion thereof by the crucible rotating in one direction relative to the seed shaft and the seed shaft rotating in the other direction and moving upward. According to the present disclosure, since a ring-shaped seed crystal is grown, a cylindrical silicon ingot can be manufactured, and since a cylindrical silicon ingot having an inner diameter is formed, a wafer retaining ring can be manufactured from the ingot without a coring task.

4 Claims, 5 Drawing Sheets

<A>

<B>

<C>

CYLINDRICAL SILICON INGOT MANUFACTURING METHOD

CROSS-REFERENCE TO RELATED APPLICATION

This application claims priority to and the benefit of Korean Patent Application No. 10-2022-0123325, filed on Sep. 28, 2022, in the Korean Intellectual Property Office, the disclosure of which is incorporated herein by reference in its entirety.

BACKGROUND

1. Field of the Invention

The present disclosure relates to an ingot manufacturing method, and more particularly, to a method of manufacturing a cylindrical silicon ingot.

2. Discussion of Related Art

A silicon ingot manufacturing technology for manufacturing a wafer which is a basic material of a semiconductor device has continued to exist along with the semiconductor industry and has been used to manufacture a wafer retaining ring, a showerhead, and the like as well as a 12-inch wafer.

Most silicon ingots that are produced are used for wafers, and wafers are used as substrates to manufacturing chips by slicing single-crystal ingots, manufactured by growing silicon (Si), gallium arsenide (GaAs), or the like using the Czochralski method, into thin pieces through a wire process and performing a polishing process.

A showerhead is manufactured to be thicker than a wafer, and a fine through-hole is formed in a front surface of the showerhead excluding an edge thereof to allow a gas to flow during manufacture of a semiconductor.

In this way, the wafer and the showerhead are manufactured in a columnar shape without an inner diameter and only have sizes of an outer diameter and a thickness.

However, in order to manufacture a wafer retaining ring having an inner diameter using a columnar ingot manufactured using the conventional silicon ingot manufacturing technology, an additional process of having to remove an inner core is necessary, which causes various problems. Specifically, prior to performing a coring task of removing an inner core in order to form an inner diameter of a wafer retaining ring, an additional cutting process of reducing a length of an ingot so that the length is suitable for the coring task is required, and in a case in which verticality is not maintained in a process in which a hole cup of the core passes through the ingot during the coring task, there is a problem that a defect occurs in the dimension of the inner diameter. In a case in which the ingot is flipped upside down and the coring process is performed two times in order to address such a problem, one more operation should be added as a process operation, and even when one more operation is added, it is not easy to accurately match surfaces. That is, there is a risk of increasing a defect rate during the coring task of the ingot. Also, an internal material removed after the coring process is entirely discarded because, due to the size of the internal material, there are not many fields in which the internal material may be used, which leads to a problem that a large amount of raw materials is wasted.

In order to address the above problems, the present disclosure provides a method for manufacturing a cylindrical silicon ingot.

SUMMARY OF THE INVENTION

The present disclosure is directed to providing a cylindrical ingot manufacturing method capable of manufacturing a wafer retaining ring having an inner diameter without a coring task.

The present disclosure is also directed to providing a method of growing ring-shaped seed crystal to manufacture a cylindrical ingot.

The present disclosure provides an ingot manufacturing method including: an operation of supplying a silicon raw material to an inside of a crucible and heating the crucible to melt the silicon raw material; an operation of fastening one end of a seed crystal having a ring-shaped cross-section to a seed shaft to supply the seed crystal to the inside of the crucible; and an operation of moving the seed crystal from a lower portion of the crucible to an upper portion thereof by the crucible rotating in one direction relative to the seed shaft and the seed shaft rotating in the other direction and moving upward.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
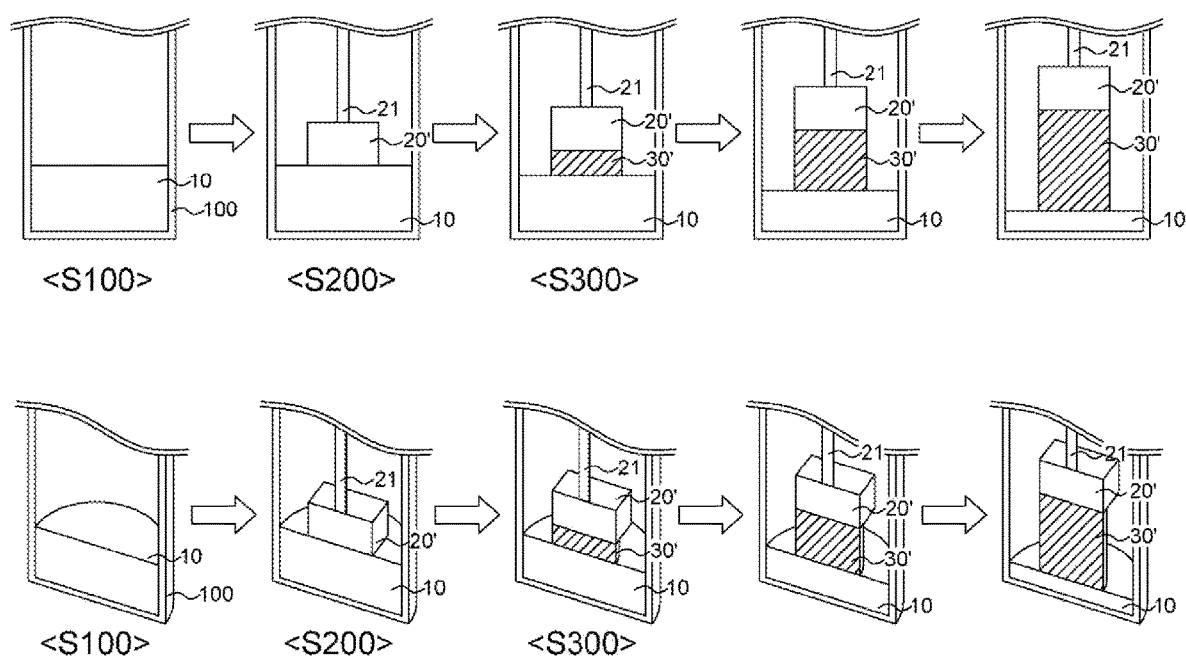
FIG. 1 is a flow diagram of a cylindrical ingot manufacturing method according to the related art.

The objectives and advantageous effects of the present disclosure will become more apparent through the detailed description below, but the objectives and advantageous effects of the present disclosure are not limited by the following description. Also, in describing the present disclosure, when detailed description of a known art related to the present disclosure is determined as having the possibility of unnecessarily obscuring the gist of the present disclosure, the detailed description thereof will be omitted.

Generally, the growth of single crystal is performed by a method in which a single crystal seed is brought into contact with a poly-crystal molten solution to grow crystal.

Here, characteristics of single crystal are formed according to seeds used, and unit crystals are formed based on the characteristics.

Generally, a seed is provided in the shape of a quadrangular bar having a horizontal length of 10 mm, a vertical length of 10 mm, and a height of 100 mm, and the seed is connected to an upper rotating shaft of a crucible and brought into contact with a molten solution to grow crystal and form an ingot.

In the present disclosure, a cylindrical ingot is manufactured by growing crystal using a seed whose cross-section is formed in a ring shape having an inner diameter, instead of using a general seed formed in the shape of a quadrangular bar as above.

Also, the present disclosure is not limited to growing a poly-crystal molten solution and may be carried out regardless of the properties such as single-crystal or poly-crystal, as long as a silicon raw material is used.

Specifically, as a seed shaft to which a seed is fastened and a crucible shaft configured to support a crucible holding a molten material rotate in directions opposite to each other, the seed shaft is pulled upward, and in this way, a single-crystal ingot is formed.

Here, in the case of the ingot, when the size of the ingot is increased due to the capillary action, an inner diameter may disappear, and the shape of a lower portion of the ingot may become the shape of a bar without an inner diameter, but such a situation can be prevented by adjusting the speed at which the seed shaft rotates and the speed at which the seed shaft is pulled.

Also, in the ingot manufacturing method according to the present disclosure, a ring-shaped seed crystal is used, and as a result, an ingot grows with a rotating speed and a pulling speed that are increased by 10 to 40% relative to the conventional manufacturing method, and a shape in which an inner diameter disappears can be prevented.

Hereinafter, the cylindrical ingot manufacturing method according to one embodiment of the present disclosure will be described in more detail with reference to the drawings.

Parts unrelated to the present disclosure are omitted in the drawings for clarity of the present disclosure, and like or similar reference numerals in the drawings represent like or similar components.

Also, the present disclosure may be implemented in various different forms and is not limited by the embodiments disclosed below.

Figure 4:
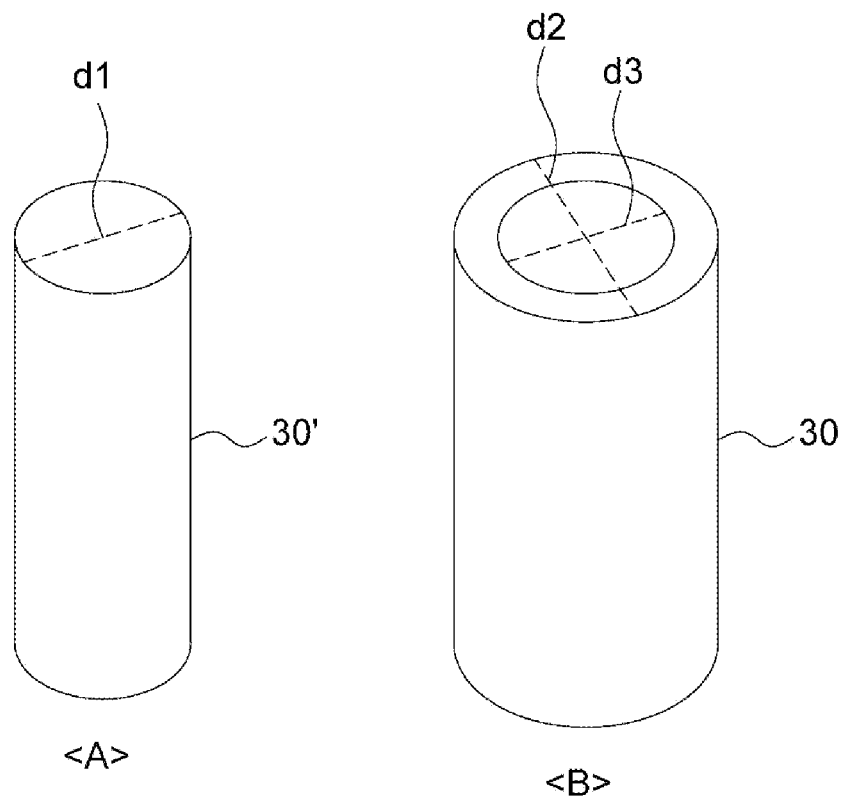
FIG. 4 shows perspective views of an ingot manufactured according to the related art and an ingot manufactured according to one embodiment of the present disclosure.

FIG. 1 is a flow diagram of a cylindrical ingot manufacturing method according to the related art, and FIG. 4 shows perspective views of an ingot manufactured according to the related art and an ingot manufactured according to one embodiment of the present disclosure.

Referring to FIG. 1, like the ingot manufacturing method according to one embodiment of the present disclosure, the cylindrical ingot manufacturing method according to the related art also includes a melting operation (S100), a supplying operation (S200), and a growing operation (S300).

However, in the related art, since a seed crystal 20' having the shape of a quadrangular bar is used, an ingot 30' having a cylindrical shape only having a first diameter d1 which is an outer diameter, instead of a cylindrical shape having an inner diameter d3, is produced.

Specifically, referring to <A> of FIG. 4, the ingot 30' manufactured by the ingot manufacturing method according to the related art is manufactured in a cylindrical shape having the first diameter d1.

On the other hand, referring to <B> of FIG. 4, an ingot 30 manufactured by the ingot manufacturing method according to one embodiment of the present disclosure is manufactured in a cylindrical shape having a second diameter d2 and the inner diameter d3.

Since a wafer retaining ring used in the process of manufacturing a 12-inch wafer generally has an inner diameter of 296 mm, the ingot 30 manufactured by the ingot manufacturing method according to one embodiment of the present disclosure may also be formed so that the inner diameter d3 is 296 mm.

Also, the ingot 30 may be formed so that the second diameter d2 is 350 mm.

Hereinafter, the shape of seed crystal and the ingot manufacturing method according to one embodiment of the present disclosure for manufacturing the above-described cylindrical ingot will be described in detail with reference to FIGS. 2, 3, and 5.

Figure 2:
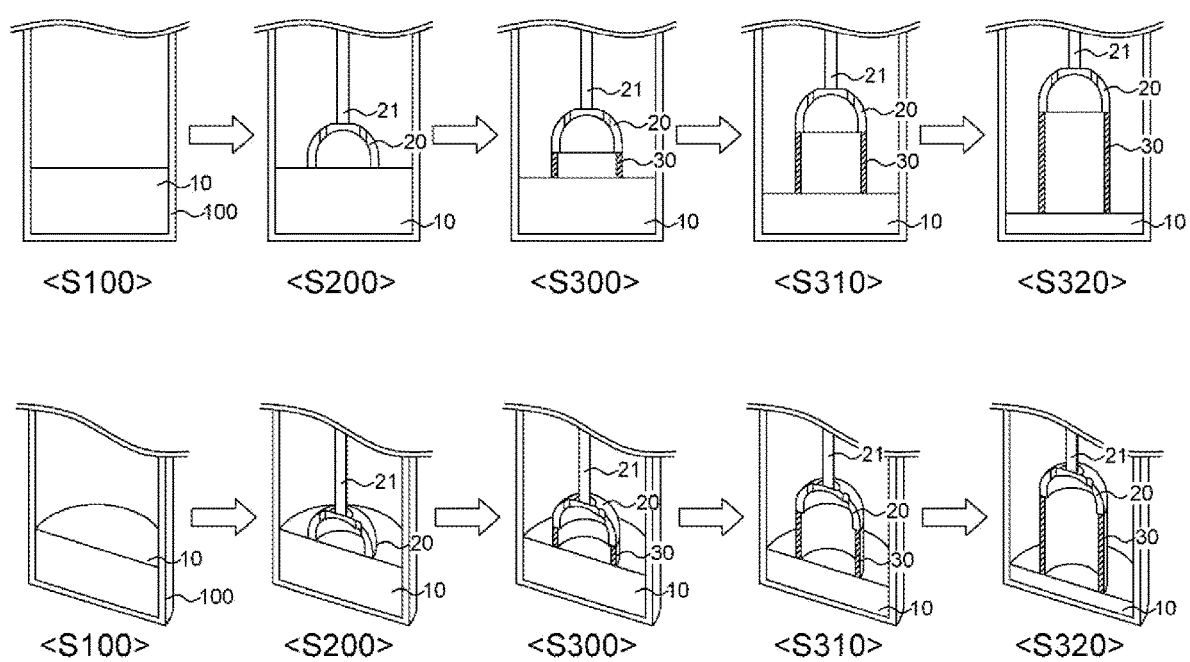
FIG. 2 is a flow diagram of a cylindrical ingot manufacturing method according to one embodiment of the present disclosure.
Figure 3:
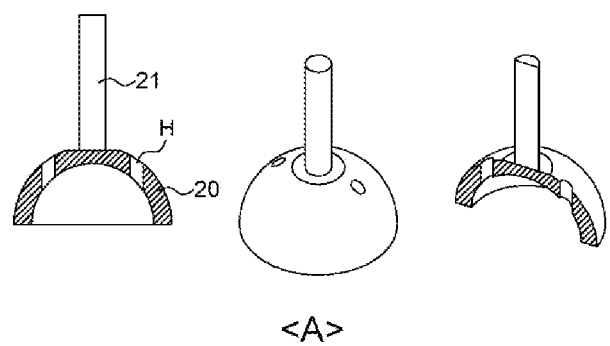
FIG. 3 shows perspective views and cross-sectional views of seed crystal according to one embodiment of the present disclosure.
Figure 3:
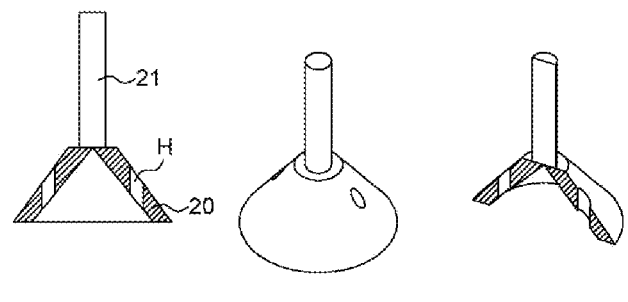
Figure 3:
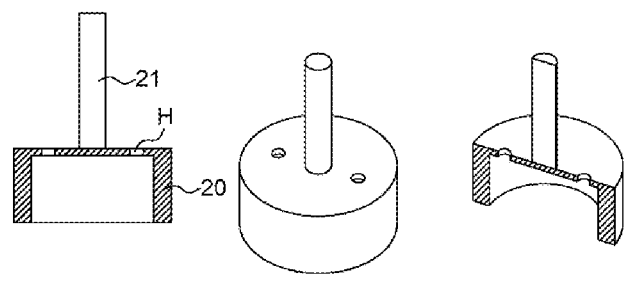
Figure 5:
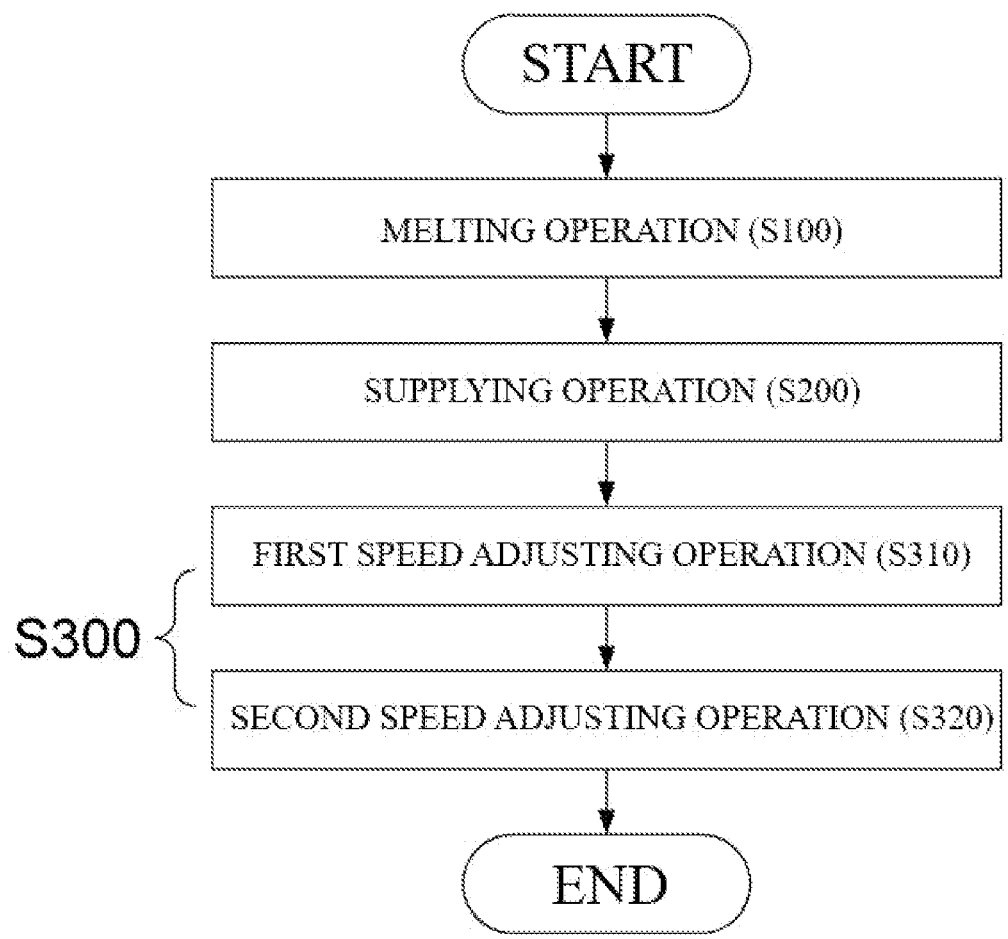
FIG. 5 is a flowchart of the cylindrical ingot manufacturing method according to one embodiment of the present disclosure.

FIG. 2 is a flow diagram of a cylindrical ingot manufacturing method according to one embodiment of the present disclosure, FIG. 3 shows perspective views and cross-sectional views of seed crystal according to one embodiment of the present disclosure, and FIG. 5 is a flowchart of the cylindrical ingot manufacturing method according to one embodiment of the present disclosure.

First, referring to FIG. 5, the cylindrical ingot manufacturing method according to one embodiment of the present disclosure includes a melting operation (S100), a supplying operation (S200), and a growing operation (S300), and the growing operation (S300) may include a first speed adjusting operation (S310) and a second speed adjusting operation (S320).

The melting operation (S100) is an operation in which a silicon raw material 10 is supplied to an inside of a crucible 100, and the crucible 100 is heated to melt the silicon raw material 10, and the supplying operation (S200) is an operation in which a seed crystal 20 having one end fastened to a seed shaft 21 is supplied to the inside of the crucible.

Here, the seed crystal 20 may be provided to have a ring-shaped cross-section and a lower surface whose inner diameter is in a range of 270 to 290 mm and outer diameter is in a range of 350 to 600 mm.

The shape of the seed crystal 20 will be described in detail below with reference to FIG. 3.

The growing operation (S300) is an operation in which the seed crystal 20 is moved from a lower portion of the crucible 100 to an upper portion thereof by the crucible 100 rotating in one direction relative to the seed shaft 21 and the seed shaft 21 rotating in the other direction and moving upward.

In an exemplary embodiment, the growing operation (S300) may further include the first speed adjusting operation (S310) in which a speed at which the seed shaft 21 rotates in the other direction is adjusted so that the seed crystal 20 forms an ingot in a predetermined shape and the second speed adjusting operation (S320) in which a speed at which the seed shaft 21 moves from the lower portion of the crucible 100 to the upper portion thereof is adjusted.

Here, the rotating speed may be in a range of 10 to 30 rpm, and the pulling speed may be in the range of 0.3 to 0.8 mm/min.

In this way, by the growing operation (S300) including the first speed adjusting operation (S310) and the second speed adjusting operation (S320), a phenomenon in which the size of the ingot 30 growing in the growing operation (S300) is increased due to the capillary action, causing an inner diameter to disappear, is prevented, and the ingot 30 can be formed in a predetermined shape.

In order to form the ingot 30 in a cylindrical shape having an inner diameter as above, the seed crystal 20 according to one embodiment of the present disclosure is provided to have a ring-shaped cross-section.

Specifically, the seed crystal 20 is provided so that a cross-section thereof taken along line perpendicular to the longitudinal direction of the seed shaft 21 has a ring shape.

More specifically, the seed crystal 20 may be provided to have a semispherical outer shape with a flat upper surface as illustrated in <A> of FIG. 3, provided to have a truncated conical outer shape as illustrated in <B> of FIG. 3, or provided to have a cylindrical outer shape as illustrated in <C> of FIG. 3.

In this way, the outer shape of the seed crystal 20 according to the present disclosure is not limited as long as a cavity is formed in the seed crystal 20, and a cross-section of the seed crystal 20 taken along line perpendicular to the longitudinal direction of the seed shaft 21 has a ring shape.

Further, since the seed shaft 21 rotates, the cross-section of the seed crystal 20 does not necessarily have a ring shape as long as a cavity is formed in the seed crystal 20, and the cross-section of the seed crystal 20 is formed to have an outer diameter and an inner diameter.

Also, the seed crystal 20 may be provided to have one or more hollows H formed to pass through at least one of a peripheral surface and an upper surface of the seed crystal 20.

Specifically, in the case in which the seed crystal 20 has a semispherical outer shape or a truncated conical outer shape as illustrated in <A> or <B> of FIG. 3, the hollows H may be formed to pass through the peripheral surface of the seed crystal 20, and in the case in which the seed crystal 20 has a cylindrical outer shape as illustrated in <C> of FIG. 3, the hollows H may be formed to pass through the upper surface of the seed crystal 20.

However, the present disclosure is not limited thereto, and by the hollows H being formed, gas generated during the growth of the ingot may be discharged through the hollows H, and thus a vacuum atmosphere in the ingot being formed can be maintained, and formation of bubbles on a surface of the ingot can be prevented.

Here, the hollows H may be formed like pin holes, but the present disclosure is not limited thereto, and the hollows H may be formed to have various other shapes and diameters.

Also, the hollows H may be provided to be formed at positions vertically symmetrical to each other based on the center of the seed crystal so that, in the process operation for the growth of the ingot, the seed crystal rotates while maintaining balance and forms an ingot having a uniform shape.

According to the present disclosure, since ring-shaped seed crystal is grown, it is possible to manufacture a cylindrical silicon ingot.

According to the present disclosure, since a cylindrical silicon ingot having an inner diameter is formed, it is possible to manufacture a wafer retaining ring from an ingot without a coring task.

According to the present disclosure, since a wafer retaining ring is manufactured from a cylindrical ingot, it is possible to reduce the amount of raw materials added to a crucible and reduce costs.

According to the present disclosure, since a cylindrical ingot is manufactured with a small amount of raw materials, and thus the size of a crucible is reduced and the sizes of a heater and a fireproof material surrounding the crucible are also reduced, it is possible to minimize costs for constructing a manufacturing facility.

According to the present disclosure, since a cylindrical silicon ingot having an inner diameter is formed, a coring task is unnecessary and thus an injury to a worker is minimized, process operations are reduced and thus a process speed and efficiency are enhanced, a defect rate is minimized, and manufacturing costs are reduced.

The exemplary embodiments of the present disclosure described above are disclosed for illustrative purposes, and various modifications, changes, and additions to the present disclosure are possible within the spirit and scope of the present disclosure by those of ordinary skill in the art. Such modifications, changes, and additions should be viewed as belonging to the scope of the claims below.

Also, since various substitutions, alterations, and changes are possible within the scope not departing from the technical spirit of the present disclosure by those of ordinary skill in the art to which the present disclosure pertains, the present disclosure is not limited by the above-described embodiments and the accompanying drawings.

In the illustrative system described above, the methods are a series of operations or blocks and are described based on flow diagrams, but the present disclosure is not limited by the order of the operations, and a certain operation may occur in a different order with another operation described above or may simultaneously occur therewith. Also, those of ordinary skill in the art should understand that the operations shown in the flow diagrams are nonexclusive, and another operation may be included, or one or more operations of the flow diagrams may be omitted without affecting the scope of the present disclosure.

What is claimed is:

1. A cylindrical ingot manufacturing method comprising:
   a melting operation in which a silicon raw material is supplied to an inside of a crucible, and the crucible is heated to melt the silicon raw material;
   a supplying operation in which one end of a seed crystal having a ring-shaped cross-section is fastened to a seed shaft, and the seed crystal is supplied to the inside of the crucible; and
   a growing operation in which the seed crystal is moved from a lower portion of the crucible to an upper portion thereof by the crucible rotating in one direction relative to the seed shaft and the seed shaft rotating in an other direction and moving upward,
   wherein the growing operation includes:
   a first speed adjusting operation in which a speed at which the seed shaft rotates in the other direction is adjusted so that the seed crystal forms an ingot in a predetermined shape; and
   a second speed adjusting operation in which a speed at which the seed shaft moves from the lower portion of the crucible to the upper portion thereof is adjusted.

2. The cylindrical ingot manufacturing method of claim 1, wherein:
   the speed at which the seed shaft rotates in the other direction is in a range of 10 to 30 rpm; and
   the speed at which the seed shaft moves from the lower portion of the crucible to the upper portion thereof is in a range of 0.3 to 0.8 mm/min.

3. The cylindrical ingot manufacturing method of claim 1, wherein a lower surface of the seed crystal has:
   an inner diameter in a range of 270 to 290 mm; and
   an outer diameter in a range of 350 to 600 mm.

4. The cylindrical ingot manufacturing method of claim 1, wherein the seed crystal has one or more hollows configured to pass through a peripheral surface thereof.

* * * * *